United States Patent [19]

Toyooka et al.

[11] 4,430,729
[45] Feb. 7, 1984

[54] SERIES RESONANT DRIVE CIRCUIT FOR MAGNETIC BUBBLE MEMORY

[75] Inventors: Takashi Toyooka, Sayama; Hirokazu Aoki, Hachioiji; Mamoru Sugie, Sayama; Shigeru Yoshizawa, Tokorozawa, all of Japan

[73] Assignee: Hitachi, Ltd., Tokyo, Japan

[21] Appl. No.: 416,043

[22] Filed: Sep. 8, 1982

[30] Foreign Application Priority Data

Sep. 9, 1981 [JP] Japan ............................... 56-140977

[51] Int. Cl.³ ............................................. G11C 19/08
[52] U.S. Cl. ........................................................ 365/6
[58] Field of Search ............................................ 365/6

[56] References Cited

U.S. PATENT DOCUMENTS 3,763,478 10/1973 Yoshizawa et al. ..................... 365/6
4,145,750 3/1979 Yoshizawa et al. ..................... 365/6
4,379,341 5/1983 Toyooka et al. ......................... 365/6

Primary Examiner—James W. Moffitt
Attorney, Agent, or Firm—Antonelli, Terry & Wands

[57] ABSTRACT

A series resonant drive circuit for a magnetic bubble memory includes X- and Y-coils arranged orthogonally to each other for generating a rotating magnetic field applied to a magnetic bubble memory chip, resonance capacitors each connected to a corresponding one of the X- and Y-coils for forming a series resonance circuit with the corresponding coil at a frequency of the rotating magnetic field, power supplies each connected to a corresponding one of the resonance circuits, and an inductance device connected in series with both of the resonance circuits and a capacitance device connected between the resonance circuits to compensate a mutual inductance due to the inductive coupling between the X- and Y-coils and a capacitance due to the capacitive coupling between the X- and Y-coils. Further, the temperature coefficient of the capacitance device is selected so that the temperature coefficients of the mutual inductance and capacitance between the coils can be compensated.

4 Claims, 8 Drawing Figures

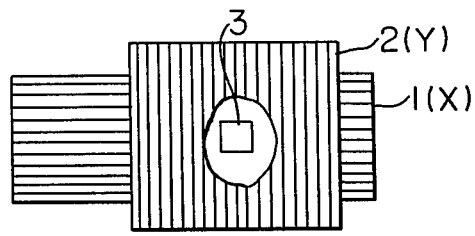
FIG. 1
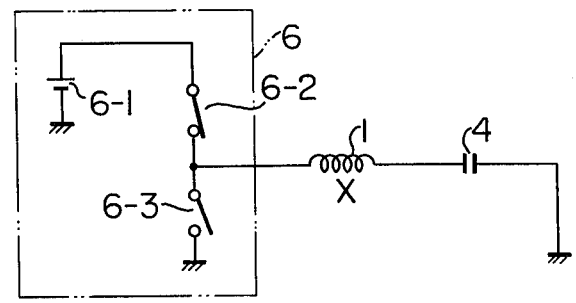
FIG. 2
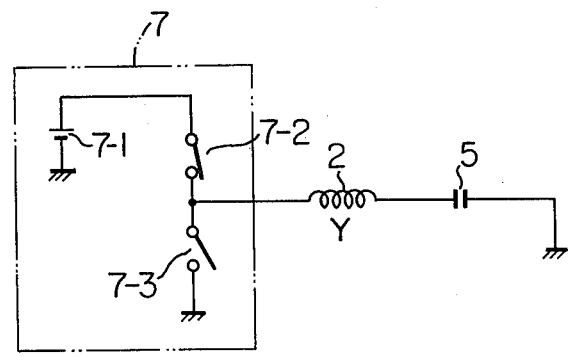
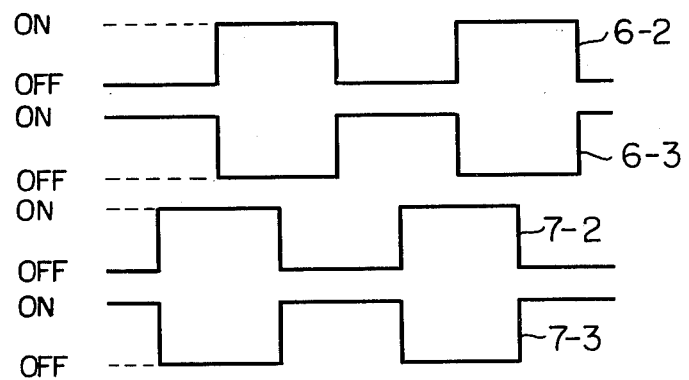
FIG. 3
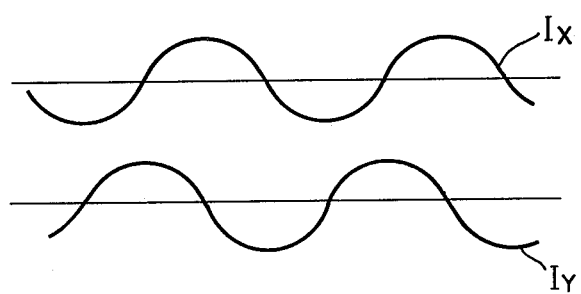

SERIES RESONANT DRIVE CIRCUIT FOR MAGNETIC BUBBLE MEMORY

BACKGROUND OF THE INVENTION

1. Field of the Invention

The present invention relates to a magnetic bubble memory, and more particularly to an improvement in the performance of a series resonant drive circuit for generating a rotating magnetic field in a magnetic bubble memory device.

2. Description of the Prior Art

As is well known in the art, a magnetic bubble memory device usually comprises a magnetic bubble memory chip constructed to move magnetic bubbles in accordance with a rotating magnetic field, a magnetic bias field device for maintaining the magnetic bubbles at a constant size and a rotating magnetic field generating device for generating the rotating magnetic field. Of those, the rotating magnetic field generating device generates the rotating magnetic field in a plane of a magnetic bubble chip 3 which is, as shown in FIG. 1, disposed within X- and Y-coils 1 and 2 arranged orthogonally to each other. The rotating magnetic field generating device is also called a magnetic bubble driver, and various rotating magnetic field generators have been proposed so far. As one example thereof, a series resonant drive circuit for the magnetic bubble memory has been proposed by the present assignee. (See U.S. Pat. No. 3,763,478 dated Oct. 2, 1973 corresponding to Japanese Patent Publication No. 50-34381 entitled "Series Resonance Drive Circuit for Magnetic Bubble Memory".) In the proposed series resonant drive circuit, as shown in FIG. 2, a series resonance circuit is formed by connecting a resonance capacitor 4 in series with the X-coil 1 and another series resonance circuit is formed by connecting a resonance capacitor 5 in series with the Y-coil 2. These resonance circuits are connected to drive sources 6 and 7, respectively. The drive sources 6 and 7 comprise D.C. power sources 6-1 and 7-1, and switching devices 6-2, 6-3 and 7-2, 7-3, respectively. The switching devices 6-2, 6-3 and 7-2, 7-3 are turned on and off as shown in a time chart of FIG. 3. Through the switching operations of the switching devices 6-2, 6-3 and 7-2, 7-3 in the drive sources 6 and 7, sinusoidal wave currents $I_X$ and $I_Y$ having a phase difference of 90 degrees therebetween flow through the X-coil 1 and the Y-coil 2, respectively. The series resonant drive circuit for the magnetic bubble memory is characterized by a very small power dissipation as compared with the case where the coils are driven directly by A.C. power supplies. As a result, the drive source circuits can be simplified and the cost thereof can be reduced.

However, when a magnetic bubble memory was manufactured using such a series resonant drive circuit and the rotating magnetic field was generated to operate the magnetic bubble memory, the following problem was encountered. That is, the strength of the rotating magnetic field varies greatly with the direction thereof, and the rotating magnetic field applied to the magnetic bubble memory chip 3 varies widely with memory modules. In order to stably operate the magnetic bubble memory chip 3, it is necessary for the variation in the strength of the rotating magnetic field to be within a range of ±10 percent of a rated value. However, the strength of the rotating magnetic field in a magnetic bubble memory varies widely, that is, a −50% to +20% variation in the strength of the rotating magnetic field is observed, and therefore it is impossible to stably operate the magnetic bubble memory chip 3. Such a variation in the strength of the rotating field becomes large as the frequency of the rotating magnetic field is made higher.

SUMMARY OF THE INVENTION

It is accordingly an object of the present invention to provide a series resonant drive circuit for a magnetic bubble memory in which variations in the strength of a rotating magnetic field are compensated, and moreover the strength of the rotating magnetic field does not depend on the direction thereof even when ambient temperature is varied.

In order to attain the above object, according to the present invention, there is provided a series resonant drive circuit for a magnetic bubble memory in which, in view of the fact that the variation of the strength of the rotating magnetic field with the direction thereof is caused by variations in X- and Y-coil currents due to the capacitive coupling between the X- and Y-coils and the inductive coupling between these coils, a reactance device for cancelling the capacitive and inductive coupling is connected to resonance circuits, and further the reactance device has a temperature coefficient capable of compensating that of the capacitive coupling and that of the inductive coupling.

With such a characteristic feature of the present invention, there can be provided a series resonant drive circuit for a magnetic memory in which the strength of the rotating magnetic field scarcely varies with the direction thereof even when ambient temperature is greatly varied. As a result, a very reliable magnetic bubble memory can be provided.

BRIEF DESCRIPTION OF THE DRAWINGS

FIG. 1 shows an arrangement of X- and Y-coils in a magnetic bubble memory;

FIGS. 2 and 3 show a fundamental circuit configuration of a series resonant drive circuit for a magnetic bubble memory and a time chart for explaining the operation thereof, respectively;

DESCRIPTION OF THE PREFERRED EMBODIMENT

Prior to explaining an embodiment of the present invention, the capacitive coupling and inductive coupling between the X- and Y-coils will first be discussed and then the effect of the coupling on the series resonant drive circuit for the magnetic bubble memory will be considered.

Figure 4:
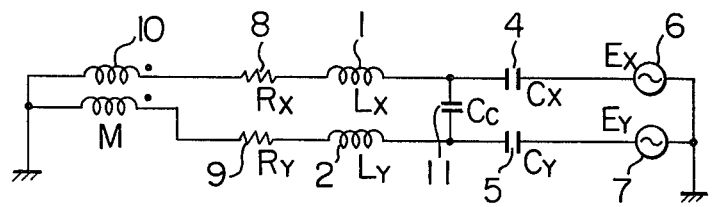
FIGS. 4 and 5 show respective equivalent circuits of two kinds of series resonant drive circuits for a magnetic bubble memory to explain a principle of the present invention.

As explained above in connection with FIG. 1, the X- and Y-coils 1 and 2 are arranged in the magnetic bubble memory to be orthogonal to each other with the X-coil 1 being disposed within the Y-coil 2. Since the X- and Y-coils 1 and 2 are arranged closely to each other, a coupling capacitance $C_c$ exists between the windings thereof. If the X- and Y-coils 1 and 2 are not mounted strictly perpendicularly to each other, a mutual inductance M exists between the coils. FIG. 4 shows an equivalent circuit of a series resonant drive circuit for driving the X- and Y-coils 1 and 2 having the coupling capacitance $C_c$ and the mutual inductance M.

Variations in the rotating magnetic field which is formed by the above drive circuit, are caused by the inductive coupling 10 (having the mutual inductance M) and capacitive coupling 11 (having a coupling capacitance $C_c$) which are generated between the X- and Y-coils 1 and 2 shown in FIG. 4.

The present inventors proposed a series resonant drive circuit for a magnetic bubble memory in which a resonant circuit is connected by a reactance device for cancelling the inductive coupling (M) 10 and capacitive coupling ($C_c$) 11 between the X- and Y-coils.

Figure 5:
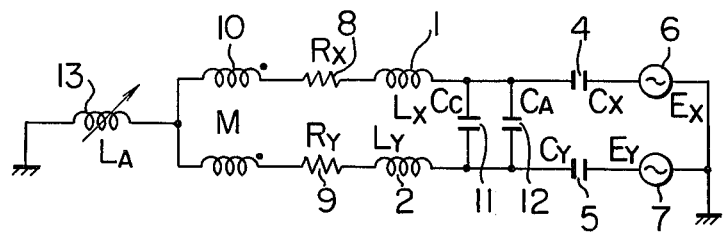

FIG. 5 shows an example of such a drive circuit. In the circuit shown in FIG. 5, an X-coil 1, a resonance capacitor 4 and a power source 6 are connected in series to form a main part of a first series resonance circuit, and a Y-coil 2, a resonance capacitor 5 and a power source 7 are connected in series to form a main part of a second series resonance circuit. The two series resonance circuits are connected together at both ends. One common end of the series resonance circuits is directly grounded and the other common end is grounded through a variable inductor 13 for correction, to complete the series resonance circuits. Further, a capacitor 12 for correction is connected between the junction of the X-coil 1 and capacitor 4 and the junction of the Y-coil 2 and capacitor 5.

The inductive coupling (M) 10 and capacitive coupling ($C_c$) 11 between the coils 1 and 2 can be substantially compensated, when an inductance $L_A$ of the variable inductor 13 and a capacitance $C_A$ of the capacitor 12 satisfies the following relation:

$$M + L_A - \frac{C_c + C_A}{C_X} L_Y = 0 \quad (1)$$

where $C_X$ indicates a capacitance of the capacitor 4, and $L_Y$ an inductance of the Y-coil 2.

In practice, a fixed capacitor having an appropriate capacitance is used as the capacitor 12 and the variable inductor 13 is finely adjusted to make substantially small the variations in the coil currents, that is, the variations in the strength of the rotating magnetic field.

A series resonant drive circuit for a magnetic bubble memory including such a correcting device was described in an application U.S. Ser. No. 303,527 filed by the present inventors on Sept. 18, 1981 and now U.S. Pat. No. 4,379,341.

However, it has been found that, notwithstanding the above-mentioned correcting device is added to the series resonant drive circuit, the strength of the rotating magnetic field formed by the drive circuit varies greatly with ambient temperature.

Figure 6:
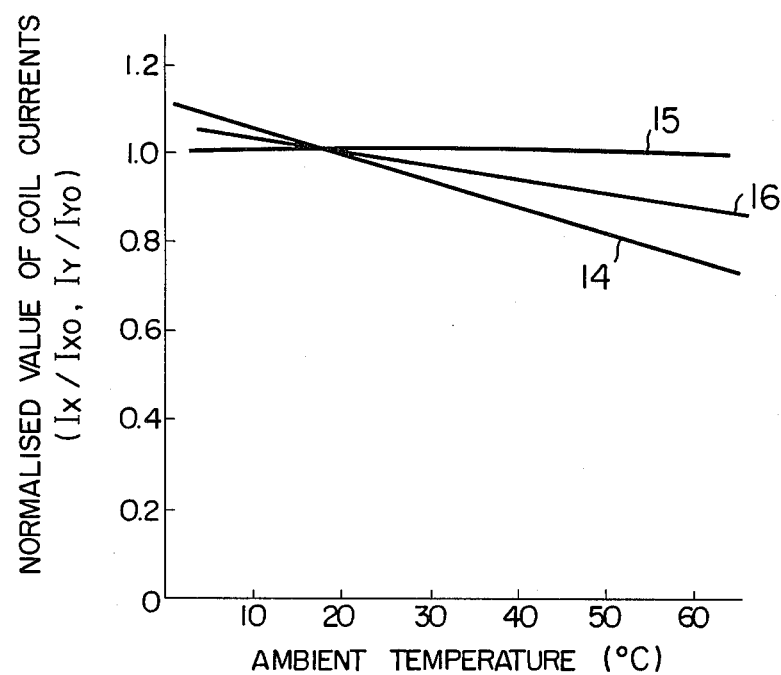
FIG. 6 is a graph showing those relations between ambient temperature and normalized coil currents which are obtained by the circuit shown in FIG. 5.

FIG. 6 shows those relations between ambient temperature and normalized coil currents which were observed in the circuit shown in FIG. 5. Referring to FIG. 6, when the temperature around the magnetic bubble memory was varied, the amplitude of a coil current $I_X$ flowing through the X-coil 1 changed as indicated by a line 14 and the amplitude of a coil current $I_Y$ flowing through the Y-coil 2 changed as indicated by a line 15. In FIG. 6, the amplitude of the coil currents $I_X$ and $I_Y$ are normalized by values $I_{XO}$ and $I_{YO}$ (at an ambient temperature of 20° C.), respectively. As is apparent from FIG. 6, the temperature coefficient of the coil current $I_Y$ is very small, and that of the coil current $I_X$ is large. Now, let us evaluate, from the lines 14 and 15, the temperature coefficients of the coil currents $I_X$ and $I_Y$. It is found that the temperature coefficient of the coil current $I_X$ is equal to $-0.6\%/°C$. and that of the coil current $I_Y$ is equal to $0\%/°C$. Further, when the X- and Y-coils 1 and 2 were driven separately, each of coil currents showed such a temperature coefficient as indicated by a line 16. In this case, each temperature coefficient of the coil currents is equally $-0.3\%/°C$.

When no coupling exists between the coils 1 and 2, respective amplitudes of the coil currents $I_X$ and $I_Y$ are given by the following equations:

$$I_X = E_X/R_X \quad (2)$$

$$I_Y = E_Y/R_Y \quad (3)$$

Each of Equations (2) and (3) shows a relation between a coil drive voltage and a coil current in the case where the X- and Y-coils 1 and 2 are drive separately. Since loss resistances $R_X$ and $R_Y$ of the X- and Y-coils are increased with an increase in ambient temperature at a rate of $0.3\%/°C$., the each temperature coefficient of the coil currents $I_X$ and $I_Y$ becomes equal to $-0.3\%/°C$. On the other hand, in the circuit shown in FIG. 5, that is, in the series resonant drive circuit including the correcting device, the coil currents $I_X$ and $I_Y$ flowing through the X- and Y-coils are given by the following equations:

$$I_X = \left\{ \left(1 + \frac{C_A + C_c}{C_Y}\right) R_Y E_X + \omega \left(M + L_A - \frac{C_c + C_A}{C_X} L_Y\right) E_Y \right\} \cdot \left\{ \left(1 + \frac{C_c + C_A}{C_X}\right) \left(1 + \frac{C_c + C_A}{C_Y}\right) R_X R_Y + \omega^2 \left(M + L_A - \frac{C_c + C_A}{C_X} L_Y\right) \left(M + L_A - \frac{C_c + C_A}{C_Y} L_X\right) \right\}^{-1} \quad (4)$$

$$I_Y = \left\{ \left(1 + \frac{C_A + C_c}{C_X}\right) R_X E_Y - \omega \left(M + L_A - \frac{C_c + C_A}{C_Y} L_X\right) E_X \right\} \cdot \left\{ \left(1 + \frac{C_c + C_A}{C_X}\right) \left(1 + \frac{C_c + C_A}{C_Y}\right) R_X R_Y + \omega^2 \left(M + L_A - \frac{C_c + C_A}{C_X} L_Y\right) \left(M + L_A - \frac{C_c + C_A}{C_Y} L_X\right) \right\}^{-1} \quad (5)$$

The following equation (6) is led from the condition of resonance:

$$L_Y/C_X = L_X/C_Y \qquad (6)$$

Then, we can find, from Equation (1) indicating the condition of correction and Equation (6), the following equation:

$$M + L_A - \frac{C_c + C_A}{C_Y} L_X = 0 \qquad (7)$$

Accordingly, we can obtain from Equations (4) and (5) the following equations:

$$I_X = \frac{E_X}{\left(1 + \frac{C_c + C_A}{C_X}\right) R_X} \qquad (8)$$

$$I_Y = \frac{E_Y}{\left(1 + \frac{C_c + C_A}{C_Y}\right) R_Y} \qquad (9)$$

In Equations (8) and (9), each temperature coefficient of the capacitances $C_X$, $C_Y$ and $C_A$ is equal to $-0.015\%/°C$. Accordingly, if the temperature coefficient of the capacitance $C_c$ is sufficiently small, the temperature coefficients of the coil currents $I_X$ and $I_Y$ given by Equations (8) and (9) are determined only by the temperature coefficient of the loss resistances $R_X$ and $R_Y$. However, measurements showed that the temperature coefficient of the capacitance $C_c$ was very large, that is, was equal to $+0.38\%/°C$. The temperature coefficient of the capacitance $C_c$ is considered to result from the temperature dependence of the dielectric constant $\epsilon$ of resin for molding the X- and Y-coils 1 and 2. In the case where the temperature coefficient of the capacitance $C_c$ is large as mentioned above, the correcting condition shown in Equations (1) and (7) become unsatisfied when the ambient temperature of the magnetic bubble memory varies. Now, let us consider the case where the inductance $L_X$ and loss resistance $R_X$ of the X-coil 1 and the capacitance $C_X$ are equal to the inductance $L_Y$ and loss resistance $R_Y$ of the Y-coil 2 and the capacitance $C_Y$, respectively, as indicated by the following equations:

$$R_X = R_Y = R \qquad (10)$$

$$L_X = L_Y = L \qquad (11)$$

$$C_X = C_Y = C \qquad (12)$$

In this case, Equations (4) and (5) are replaced by the following equations:

$$I_X = \qquad (13)$$

$$\frac{\left(1 + \frac{C_A + C_c}{C}\right) RE + \omega \left(M + L_A - \frac{C_c + C_A}{C} L\right) E}{\left(1 + \frac{C_A + C_c}{C}\right)^2 R^2 + \omega^2 \left(M + L_A - \frac{C_c + C_A}{C} L\right)^2}$$

$$I_Y = \qquad (14)$$

-continued $$\frac{\left(1 + \frac{C_A + C_c}{C}\right) RE - \omega \left(M + L_A - \frac{C_c + C_A}{C} L\right) E}{\left(1 + \frac{C_A + C_c}{C}\right)^2 R^2 + \omega^2 \left(M + L_A - \frac{C_c + C_A}{C} L\right)^2}$$

where $$E = RI_o \qquad (15)$$

and $I_o$ indicates a nominal value of coil current.

Now, let us make the following substitutions:

$$\frac{C_A + C_c}{C} = \alpha \qquad (16)$$

$$\frac{\omega L}{R} = Q \qquad (17)$$

$$\frac{M + L_A}{L} = \beta \qquad (18)$$

Then, we can obtain from Equations (13) and (14) the following equations:

$$I_X = \frac{E}{R} \cdot \frac{(1 + \alpha) + (\beta - \alpha)Q}{(1 + \alpha)^2 + (\beta - \alpha)^2 Q^2} \qquad (19)$$

$$I_Y = \frac{E}{R} \cdot \frac{(1 + \alpha) - (\beta - \alpha)Q}{(1 + \alpha)^2 + (\beta - \alpha)^2 Q^2} \qquad (20)$$

Now, let us assume that the inductance L of the X- and Y-coils 1 and 2, the capactance C of the resonance capacitors 4 and 5, the capacitance $C_A$ of the correcting capacitor 12, and the inductance $L_A$ of the correcting inductor 13 are substantially independent of temperature. Then, taking into consideration only the temperature coefficients of the parameters $C_c$, M, R and Q, we can obtain the following equation:

$$\frac{dI_X}{dT} = \frac{dR}{dT} \cdot \left(\frac{-E}{R^2}\right) \left\{\frac{(1 + \alpha) + (\beta - \alpha)Q}{(1 + \alpha)^2 + (\beta - \alpha)^2 Q^2}\right\} + \frac{E}{R} \cdot \qquad (21)$$

$$\{(1 + \alpha)^2 + (\beta - \alpha)^2 Q^2\}^{-2} \cdot \Bigg[ \{(1 + \alpha)^2 + (\beta - \alpha)^2 Q^2\} \cdot$$

$$\left\{\frac{d\alpha}{dT} + (\beta - \alpha)\frac{dQ}{dT} + Q\left(\frac{d\beta}{dT} - \frac{d\alpha}{dT}\right)\right\} -$$

$$\left\{2(1 + \alpha)\frac{d\alpha}{dT} + 2Q(\beta - \alpha)^2 \frac{dQ}{dT} + 2Q^2(\beta - \alpha) \cdot \right.$$

$$\left.\left(\frac{d\beta}{dT} - \frac{d\alpha}{dT}\right)\right\}\Bigg]$$

Setting $L_X = L_Y = L$ and $C_X = C_Y = C$ in Equations (6) and (7), we can obtain the following equation:

$$\frac{M + L_A}{L} = \frac{C_A + C_c}{C} \qquad (22)$$

When ambient temperature is only a little different from a temperature at which the correction was made, the following relation is obtained.

$$\alpha \approx \beta \tag{23}$$

Since the values of the parameters $\alpha$ and $\beta$ are are far smaller than 1, the following approximation can be made:

$$1 + \alpha \approx 1 \tag{24}$$

$$\beta - \alpha \approx 0 \tag{25}$$

Accordingly, we can obtain from Equation (21) the following equation:

$$\frac{dI_X}{dT} = \frac{-E}{R^2} \cdot \frac{dR}{dT} + \frac{E}{R}\left\{ Q\frac{d\beta}{dT} - (Q+1)\frac{d\alpha}{dT} \right\} \tag{26}$$

Further, we can find from Equations (16) and (18) the following relations:

$$\frac{d\alpha}{dT} = \frac{1}{c} \frac{dC_c}{dT} \tag{27}$$

$$\frac{d\beta}{dT} = \frac{1}{L} \frac{dM}{dT} \tag{28}$$

Thus, we can obtain from Equation (26) the following equation:

$$\frac{dI_X}{dT} = \frac{-E}{R^2} \cdot \frac{dR}{dT} + \frac{E}{R}\left\{ \frac{Q}{L} \frac{dM}{dT} - \frac{(Q+1)}{C} \frac{dC_c}{dT} \right\} \tag{29}$$

Similarly, we can obtain the following equation:

$$\frac{dI_Y}{dT} = \frac{-E}{R^2} \cdot \frac{dR}{dT} - \frac{E}{R}\left\{ \frac{Q}{L} \frac{dM}{dT} - \frac{(Q+1)}{C} \frac{dC_c}{dT} \right\} \tag{30}$$

Further, when ambient temperature is only a little different from the temperature at which the correction was made, the following relations hold:

$$I_X \approx I_Y \approx \frac{E}{R} \tag{31}$$

Then, we can obtain from Equations (29) and (30) the following equations:

$$\frac{1}{I_X} \frac{dI_X}{dT} = \frac{-1}{R} \frac{dR}{dT} + \left( \frac{Q}{L} \frac{dM}{dT} - \frac{(Q+1)}{C} \frac{dC_c}{dT} \right) \tag{32}$$

$$\frac{1}{I_Y} \frac{dI_Y}{dT} = \frac{-1}{R} \frac{dR}{dT} - \left( \frac{Q}{L} \frac{dM}{dT} - \frac{(Q+1)}{C} \frac{dC_c}{dT} \right) \tag{33}$$

Putting in Equations (32) and (33) the temperature coefficient of the inductance M, namely, $$\frac{1}{M} \frac{dM}{dT}$$

and that of the capacitance $C_c$, namely, $$\frac{1}{C_c} \frac{dC_c}{dT},$$

we can obtain the following equations:

$$\frac{1}{I_X} \frac{dI_X}{dT} = -\left( \frac{1}{R} \frac{dR}{dT} \right) + \left( \frac{QM}{T} \right) \cdot \left( \frac{1}{M} \frac{dM}{dT} \right) - \frac{(Q+1)C_c}{C}\left( \frac{1}{C_c} \frac{dC_c}{dT} \right) \tag{34}$$

$$\frac{1}{I_Y} \frac{dI_Y}{dT} = -\left( \frac{1}{R} \frac{dR}{dT} \right) - \left( \frac{QM}{L} \right) \cdot \left( \frac{1}{M} \frac{dM}{dT} \right) + \frac{(Q+1)C_c}{C}\left( \frac{1}{C_c} \frac{dC_c}{dT} \right) \tag{35}$$

In other words, the temperature coefficients of the coil currents $I_X$ and $I_Y$ defined by $$\frac{1}{I_X} \frac{dI_X}{dT} \text{ and } \frac{1}{I_Y} \frac{dI_Y}{dT}$$

respectively, are expressed by a linear combination of the temperature coefficient of the loss resistance R defined by $$\frac{1}{R} \frac{dR}{dT},$$

that of the mutual inductance M defined by $$\frac{1}{M} \frac{dM}{dT}$$

and that of the coupling capacitance $C_c$ defined by $$\frac{1}{C_c} \frac{dC_c}{dT}.$$

When the inductance L and loss resistance R of the X- and Y-coils 1 and 2 and the drive frequency are made equal to 60 $\mu$H, 20$\Omega$ and 300 kHz, respectively, the parameters Q and C become as follows:

$$Q = 47.1 \tag{36}$$

$$C = 5630 \text{ pF} \tag{37}$$

Further, in this case, the coupling capacitance $C_c$ between the coils is equal to 100 pF, the temperature coefficient of the capacitance $C_c$ is equal to 0.38%/°C., the temperature coefficient of the loss resistance R is equal to 0.30%/°C., the mutual inductance M is equal to +0.20 $\mu$H, and the temperature coefficient of the mutual inductance M is equal to 0.13%/°C. When the above values are inserted in Equations (34) and (35), the temperature coefficients of the coil currents $I_X$ and $I_Y$ become equal to $-0.60$%/°C. and 0.0%/°C., respectively. These values agree with the measured values obtained from FIG. 6.

Figure 7:
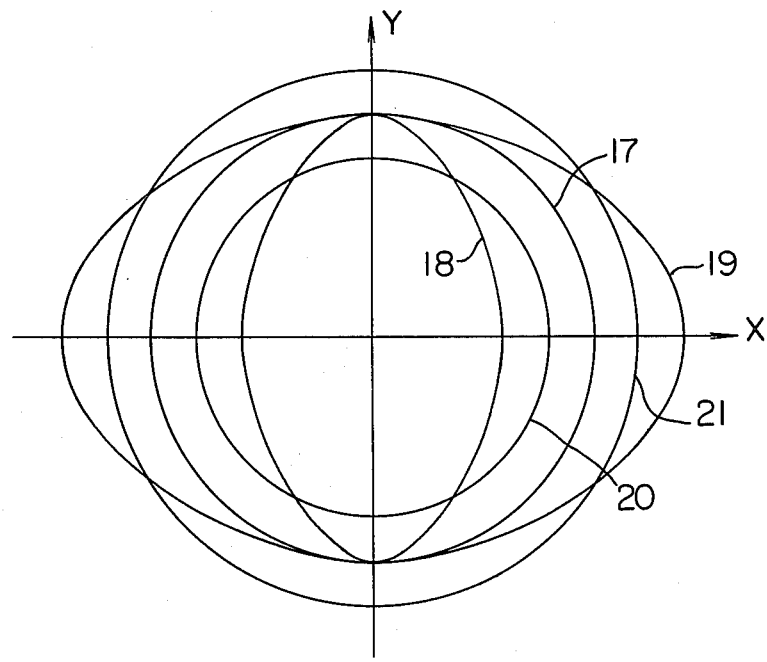
FIG. 7 is a graph showing loci of rotating magnetic field which are obtained by the circuit shown in FIG. 5.

As mentioned above, variations in each of the coil currents flowing through the X- and Y-coils 1 and 2 can be reduced by compensating the inductive and capacitive coupling by a correcting device. However, the temperature coefficients of the coil currents are affected by the above-mentioned coupling, and therefore become different from a value obtained in the case where no coupling exists between the X- and Y-coils. When only the temperature coefficient of one coil current becomes large as mentioned previously, the locus of the rotating magnetic field varies with ambient temperature as shown in FIG. 7. Referring to FIG. 7, when ambient temperature is equal to a temperature at which the correcting device was adjusted, the locus of the rotating magnetic field has the form of a circle 17. When ambient temperature becomes higher than the temperature at which the adjustment was made, the temperature coefficient of the current flowing through the X-coil 1 decreases at a rate of $-0.6\%/°C$., but the temperature coefficient of the current flowing through the Y-coil 2 is $0.0\%/°C$. Accordingly, the locus of the rotating magnetic field has the form of an ellipse 18 with its minor and major axes on X- and Y-axes. On the contrary, when ambient temeprature becomes lower than the temperature at which the adjustment was made, the amplitude of the current flowing through the X-coil 1 increases, but the amplitude of the current flowing through the Y-coil 2 is kept constant. Accordingly, the locus of the rotating magnetic field has the form of an allipse 19 with its major and minor axes on X- and Y-axes. On the other hand, if the current flowing through the X-coil 1 and the current flowing through the Y-coil 2 have the same temperature coefficient, the locus of the rotating magnetic field will have a circle 20 at a higher temperature or a circle 21 at a lower temperature.

The above-mentioned correcting device has the following problems.

(a) Since only the magnetic field strength in the X-direction varies greatly, the propagation characteristic of magnetic bubbles and the characteristic of a functional part are varied greatly when the rotating magnetic field takes the X-direction. Accordingly, the bias margin of the bubble propagation and the functional part operation varies greatly with temperature.

(b) The phase of the rotating magnetic field varies greatly with temperature. Accordingly, the bias margin of the functional part which is essentially narrow in phase margin, is made small by a temperature change.

Therefore, it is necessary to eliminate, by some means or other, the difference between the temperature coefficients of the currents flowing through the X- and Y-coils 1 and 2. According to the present invention, the above problem can be solved by appropriately selecting the temperature coefficient of the reactance of the reactance device (serving as the correcting device) so that the temperature dependence of the inductive and capacitive coupling between the X- and Y-coils can be compensated.

Figure 8:
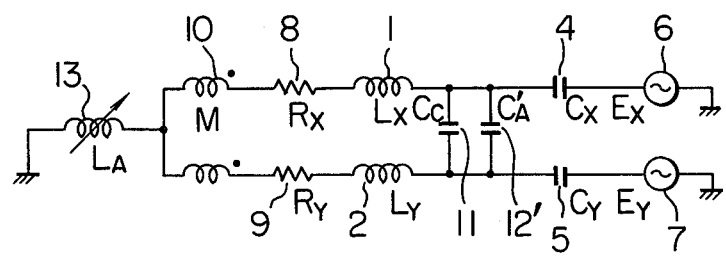
FIG. 8 shows an equivalent circuit of an embodiment of a series resonant drive circuit for a magnetic bubble memory according to the present invention.

FIG. 8 shows an equivalent circuit of an embodiment of a series resonant drive circuit for a magnetic bubble memory according to the present invention. The most characteristic feature of the present invention resides in that the correcting capacitor 12 (having the capacitance $C_A$) in the drive circuit shown in FIG. 5 is replaced by a correcting capacitor 12' which has a capacitance $C_A'$ having a predetermined temperature coefficient. In the case where the capacitance $C_c$ lies in a range of 100 pF $\pm 10$ pF and the mutual inductance M is in a range of $-1.0$ $\mu H$ to $+1.0$ $\mu H$, when the inductance L, loss resistance R and drive frequency are equal to 50 $\mu H$, 2$\Omega$ and 300 kHz, respectively, the capacitance $C_A'$ of the correcting capacitor and the inductance $L_A$ of the correcting inductor are set to 240 pF and 3 $\mu H$ $\pm 1.1$ $\mu H$, respectively. In this case, we can obtain from Equations (34) and (35) the temperature coefficients of the coil currents $I_X$ and $I_Y$ as follows:

$$\frac{1}{I_X} \frac{dI_X}{dT} = -\left(\frac{1}{R} \frac{dR}{dT}\right) + \left(\frac{QM}{L}\right) \cdot \left(\frac{1}{M} \frac{dM}{dT}\right) - \frac{(Q+1)(C_c + C_A')}{C} \cdot \frac{1}{(C_c + C_A')} \frac{d(C_c + C_A')}{dT} \quad (38)$$

$$\frac{1}{I_Y} \frac{dI_Y}{dT} = -\left(\frac{1}{R} \frac{dR}{dT}\right) - \left(\frac{QM}{L}\right) \cdot \left(\frac{1}{M} \frac{dM}{dT}\right) + \frac{(Q+1)(C_c + C_A')}{C} \cdot \frac{1}{(C_c + C_A')} \frac{d(C_c + C_A')}{dT} \quad (39)$$

In order to make the temperature coefficient of the coil current $I_X$ equal to that of the coil current $I_Y$, it is required to satisfy the following relation:

$$\frac{QM}{L} \cdot \left(\frac{1}{M} \frac{dM}{dT}\right) = \frac{(Q+1)(C_c + C_A')}{C} \cdot \frac{1}{(C_c + C_A')} \frac{d(C_c + C_A')}{dT} \quad (40)$$

Now, let us assume that the mutual inductance M is equal to 0.2 $\mu H$ and the temperature coefficient of the mutual inductance M defined by $$\frac{1}{M} \frac{dM}{dT}$$

is equal to 0.13%/°C. Substituting values 47.1, 100 pF, 5630 pF, 240 pF and 50 $\mu H$ for the parameters Q, $C_c$, C, $C_A'$ and L in Equation (40), respectively, we can obtain the following equation:

$$\frac{1}{(C_c + C_A')} \frac{d(C_c + C_A')}{dT} = 8.43 \times 10^{-5} \quad (41)$$

Further, we can readily obtain the following equation:

$$\frac{1}{(C_c + C_A')} \cdot \frac{d(C_c + C_A')}{dT} = \frac{C_c}{(C_c + C_A')} \cdot \quad (42)$$

$$\left(\frac{1}{C_c} \frac{dC_c}{dT}\right) + \frac{C_A'}{(C_c + C_A')} \left(\frac{1}{C_A'} \frac{dC_A'}{dT}\right)$$

Accordingly, the $$\frac{1}{C_A'} \frac{dC_A'}{dT}$$

can be expressed as follows:

$$\frac{1}{C_A'} \frac{dC_A'}{dT} = \quad (43)$$

-continued $$\frac{C_c + C'_A}{C'_A} \left( \frac{1}{(C_c + C'_A)} \frac{d(C_c + C'_A)}{dT} \right) - $$

$$\frac{C_c}{C'_A} \left( \frac{1}{C_c} \frac{dC_c}{dT} \right).$$

Inserting in Equation (43) the value given by Equation (41) and the value of $$\frac{1}{C_c} \frac{dC_c}{dT} (= 0.38\%/°C.),$$

we can obtain the value of $$\frac{1}{C'_A} \frac{dC'_A}{dT}$$

as follows:

$$\frac{1}{C'_A} \frac{dC'_A}{dT} = -0.146 \times 10^{-2} \quad (44)$$

Accordingly, Equation (40) can be satisfied by making the temperature coefficient of the capacitance $C_A'$ of the correcting capacitor equal to $-0.146\%/°C$. That is, in this case, the temperature coefficients of the coil currents $I_X$ and $I_Y$ are both made equal to $-0.3\%/°C$., and therefore the previously-mentioned problems (a) and (b) can be eliminated.

As has been explained in the foregoing, according to the present invention, a series resonant drive circuit for a magnetic bubble memory includes a reactance device for correcting the mutual inductance and coupling capacitance caused by the inductive and capacitive coupling between X- and Y-coils, and moreover the temperature coefficient of the reactance of the reactance device is selected so that the variations of the mutual inductance and coupling capacitance with ambient temperature can be compensated. As a result, the currents flowing through the X- and Y-coils are changed at the same rate when ambient temperature varies, and therefore the locus of a rotating magnetic field formed in a plane of a magnetic bubble memory chip always has the form of a circle. Accordingly, the strength of the rotating magnetic field becomes equal in all directions at all times, and magnetic bubbles can be securely moved. Therefore, a magnetic bubble memory having a series resonant drive circuit accoding to the present invention is very reliable.

In the above-mentioned embodiment, after determining the optimum inductance value of the correcting inductor using an adjustable inductor a fixed inductor having such a value may be used therefor.

Alternatively, the correcting capacitor 12' may be replaced by an adjustable capacitor.

We claim:

1. A series resonant drive circuit for a magnetic bubble memory, comprising:
   (a) a magnetic bubble memory chip in which magnetic bubbles are driven in accordance with a rotating magnetic field;
   (b) X- and Y-coils arranged orthogonally to each other to generate said rotating magnetic field in a plane of said magnetic bubble memory chip;
   (c) resonance capacitors each connected in series with a corresponding one of said X- and Y-coils to form a series resonance circuit with the corresponding one of said X- and Y-coils at a frequency of said rotating magnetic field;
   (d) power supplies each connected to a corresponding one of said resonance circuits to supply a cyclic wave current containing only an A.C. component to the corresponding one of said resonance circuits; and
   (e) reactance means connected to said resonance circuits to compensate a mutual inducatnce due to the inductive coupling between said X- and Y-coils and a capacitance due to the capacitive coupling between said X- and Y-coils, said reactance means having a temperature coefficient selected to compensate the temperature coefficient of said mutual inductance and said capacitance.

2. A series resonant drive circuit for a magnetic bubble memory according to claim 1, wherein said reactance means includes an inductor connected between a junction of said X- and Y-coils and said power supplies, and a capacitor connected between said resonance circuits.

3. A series resonant drive circuit for a magnetic bubble memory according to claim 2, wherein at least one of said inductor and capacitor is a circuit element whose impedance is variable.

4. A series resonant drive circuit for a magnetic bubble memory according to claim 2, wherein the temperature coefficient of said capacitor is selected so that the temperature coefficient of said mutual inductance due to said inductive coupling between said X- and Y-coils and the temperature coefficient of said capacitance due to said capacitive coupling between said X- and Y-coils can be compensated.

* * * * *